(12) United States Patent
Chu

(10) Patent No.: US 9,025,410 B2
(45) Date of Patent: May 5, 2015

(54) SEMICONDUCTOR MEMORY DEVICES AND SEMICONDUCTOR SYSTEM HAVING PARAMETERS, AND METHODS OF TESTING THE SAME

(71) Applicant: SK Hynix Inc., Icheon-si Gyeonggi-do (KR)

(72) Inventor: Shin Ho Chu, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 138 days.

(21) Appl. No.: 13/846,777

(22) Filed: Mar. 18, 2013

(65) Prior Publication Data
US 2014/0177314 A1    Jun. 26, 2014

(30) Foreign Application Priority Data
Dec. 20, 2012 (KR) .......................... 10-2012-0150089

(51) Int. Cl.
| | |
|---|---|
| G11C 8/00 | (2006.01) |
| G11C 17/16 | (2006.01) |
| G11C 29/02 | (2006.01) |
| G11C 29/50 | (2006.01) |
| G11C 7/04 | (2006.01) |
| G11C 7/22 | (2006.01) |
| G11C 8/18 | (2006.01) |

(52) U.S. Cl.
CPC .................. *G11C 17/16* (2013.01); *G11C 8/18* (2013.01); *G11C 29/023* (2013.01); *G11C 29/028* (2013.01); *G11C 29/50012* (2013.01); *G11C 7/04* (2013.01); *G11C 7/222* (2013.01)

(58) Field of Classification Search
CPC ........... G11C 8/18; G11C 7/22; G11C 7/1051
USPC ................................ 365/233, 233.5, 193, 194
See application file for complete search history.

(56) References Cited

U.S. PATENT DOCUMENTS

| | | | | |
|---|---|---|---|---|
| 7,016,257 | B2 * | 3/2006 | Kim et al. ................. | 365/189.15 |
| 7,117,381 | B2 * | 10/2006 | Kim et al. ...................... | 713/400 |
| 7,652,938 | B2 * | 1/2010 | Tseng ........................... | 365/194 |
| 2009/0091992 | A1 * | 4/2009 | Lee ............................... | 365/193 |

FOREIGN PATENT DOCUMENTS

KR          100813554 B1    3/2008

* cited by examiner

*Primary Examiner* — Connie Yoha
(74) *Attorney, Agent, or Firm* — William Park & Associates Ltd.

(57) ABSTRACT

A semiconductor memory device may be effectively evaluated by a test that compares the phase of an internally generated control signal with the phase of an internally generated clock signal. Specifically, if the phase of the internal data strobe signal IDQS is synchronized with the phase of the internal clock signal ICLK through the test, the data strobe signal DQS may also be synchronized with the external clock signal CLK. Thus, the test may prevent certain critical parameters, for example, AC parameter tDQSCK, from being out of an allowable range over PVT (process, voltage, and temperature variation). The test helps ensure that the semiconductor memory device will operate properly in read mode.

23 Claims, 3 Drawing Sheets

SEMICONDUCTOR MEMORY DEVICES AND SEMICONDUCTOR SYSTEM HAVING PARAMETERS, AND METHODS OF TESTING THE SAME

CROSS-REFERENCE TO RELATED APPLICATION

The present application claims priority under 35 U.S.C 119(a) to Korean Application No. 10-2012-0150089, filed on Dec. 20, 2012, in the Korean Intellectual Property Office, which is incorporated herein by reference in its entirety as though set forth in full.

BACKGROUND

In general, semiconductor memory devices such as double data rate synchronous dynamic random access memory (DDR SDRAM) devices are characterized by various alternating current (AC) parameter specifications for guaranteeing allowable margins in data transmission. The AC parameters of the semiconductor memory devices may include 'tAC', 'tDQSCK' and 'tDQSS'. The AC parameter 'tAC' has a relationship between a clock signal and data signals, the AC parameter 'tDQSCK' has a relationship between the clock signal and data strobe signals, and the AC parameter 'tDQSS' has a relationship between the data signals and the data strobe signals.

In more detail, the AC parameter 'tDQSCK' may relate to a skew between external clock signals and data strobe signals. If the AC parameter 'tDQSCK' is out of an allowable range, the semiconductor memory devices may malfunction during a read operation. Accordingly, after the semiconductor memory devices are fabricated and/or packaged, the semiconductor memory devices may be evaluated or tested to measure the AC parameters.

SUMMARY

According to an embodiment, a semiconductor memory device includes a delay controller and a clock delay unit. The delay controller compares a phase of an internal data strobe signal with a phase of an internal clock signal in response to first to third test mode signals and a read command signal, thereby generating delay control signals. The clock delay unit retards the internal clock signal by a first delay time controlled according to the delay control signals, thereby generating a delayed clock signal for creating a data strobe signal.

According to an embodiment, a semiconductor system includes a semiconductor memory device and a test circuit. The semiconductor memory device compares a phase of an internal data strobe signal with a phase of an internal clock signal to generate a flag signal outputted to a pad. Further, the semiconductor memory device programs fuses in response to count signals and generates fuse signals using the programmed fuses. In addition, the semiconductor memory device retards the internal clock signal by a first delay time controlled according to delayed control signals generated from the count signals or the fuse signals, thereby generating a delayed clock signal for creating a data strobe signal. The test circuit receives the flag signal to generate the count signals.

According to an embodiment, a method of testing a semiconductor memory device includes comparing a phase of an internal data strobe signal with a phase of an internal clock signal in response to first to third test mode signals and a read command signal to generate delay control signals, and retarding the internal clock signal by a first delay time controlled according to the delay control signals to generate a delayed clock signal for creating a data strobe signal.

BRIEF DESCRIPTION OF THE DRAWINGS

The above and other features and advantages will become readily apparent by reference to the following detailed description when considered in conjunction with the accompanying drawings wherein.

DETAILED DESCRIPTION

Example embodiments in accordance with the present invention will be described hereinafter with reference to the accompanying drawings. Those skilled in the art will appreciate that various modifications, additions, and substitutions are possible, without departing from the spirit and scope of the invention as set forth in the accompanying claims.

Figure 1:
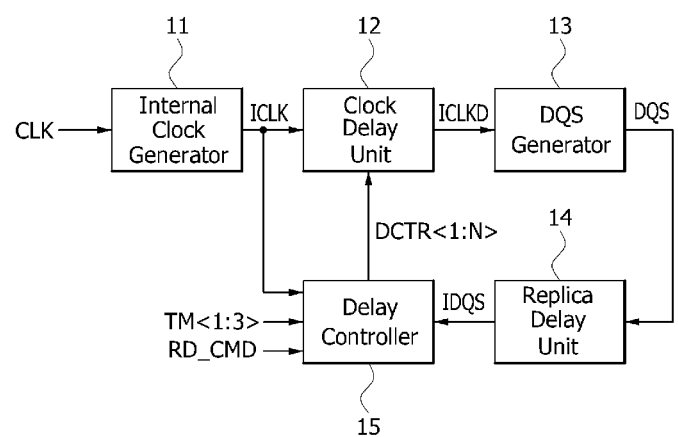
FIG. 1 is a block diagram illustrating a configuration of a semiconductor memory device according to some embodiments.

As shown in FIG. 1, a semiconductor memory device may be configured to include an internal clock generator 11, a clock delay unit 12, a data strobe signal (DQS) generator 13, a replica delay unit 14 and a delay controller 15.

The internal clock generator 11 may receive an external clock signal CLK to generate an internal clock signal ICLK. In more detail, the internal clock generator 11 may buffer the external clock signal CLK and may reflect information such as a read latency and a burst length to generate the internal clock signal ICLK during a read operation.

The clock delay unit 12 may be configured to delay the internal clock signal ICLK and generate a delayed clock signal ICLKD. A delay time of the clock delay unit 12 may be controlled according to delay control signals DCTR<1:N>. For example, the delay time of the clock delay unit 12 may be increased by a unit delay time whenever the delay control signals DCTR<1:N> are counted up by one bit.

The data strobe signal (DQS) generator 13 may be configured to generate a data strobe signal DQS for strobe of data in response to the delayed clock signal ICLKD. The DQS generator 13 may be configured using a general circuit that generates the data strobe signal in synchronization with a clock signal.

The replica delay unit 14 may be configured to delay the data strobe signal DQS and generate an internal data strobe signal IDQS. A delay time of the replica delay unit 14 may be set to be equal to that of the clock delay unit 12.

The delay controller 15 may be configured to compare the internal data strobe signal IDQS with the internal clock signal ICLK in response to first to third test mode signals TM<1:3> and a read command signal RD_CMD and generate the delay control signals DCTR<1:N>. The delay control signals DCTR<1:N> may be counted up by one bit whenever a phase of the internal data strobe signal IDQS is different from a phase of the internal clock signal ICLK, after the delay controller 15 receives the read command signal RD_CMD. The first to third test mode signals TM<1:3> may be generated in an external test circuit separated from the semiconductor memory device or may be generated in an internal portion of the semiconductor memory device. The first test mode signal TM<1> may be set to have an enablement period in which a level of the internal clock signal ICLK synchronized with a rising edge of the internal data strobe signal IDQS can be changed. The second test mode signal TM<2> may be set to have a period which is enabled after the enablement period of the first test mode signal TM<1> terminates, and the third test mode signal TM<3> may be set to have a period which is enabled after the enablement period of the second test mode signal TM<2> terminates.

Figure 2:
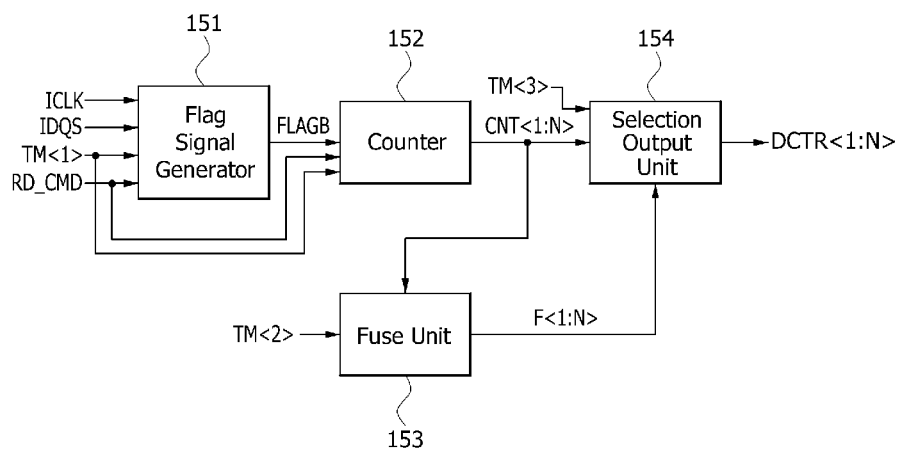
FIG. 2 is a block diagram illustrating a configuration of a delay controller included in the semiconductor memory device of FIG. 1.

As shown in FIG. 2, the delay controller 15 may be configured to include a flag signal generator 151, a counter 152, a fuse unit 153 and a selection output unit 154.

The flag signal generator 151 may be configured to generate a flag signal FLAGB which is enabled to a logic "low" level, until the level of the internal clock signal ICLK synchronized with a rising edge of the internal data strobe signal IDQS is changed, when the flag signal generator 151 receives the read command signal RD_CMD and the first test mode signal TM<1> is enabled. The flag signal FLAGB may be disabled to have a logic "high" level if a level of the internal clock signal ICLK synchronized with a rising edge of the internal data strobe signal IDQS is changed.

The counter 152 may receive the flag signal FLAGB enabled to a logic "low" level to sequentially increase a digital number of count signals CNT<1:N> one bit by one bit while the first test mode signal TM<1> is enabled and the read command signal RD_CMD is inputted to the counter 152. The counter 152 may terminate an operation of counting the digital number of the count signals CNT<1:N> if the flag signal FLAGB is disabled to a logic "high" level.

The fuse unit 153 may include N-number of fuses (not shown) which are programmed according to the count signals CNT<1:N> when the second test mode signal TM<2> is enabled. The N-number of fuses may correspond to respective ones of the count signals CNT<1:N>, and each of the N-number of fuses may be cut or not according to the corresponding signal of the count signals CNT<1:N>. The fuse unit 153 may generate fuse signals F<1:N> using the N-number of programmed fuses and may output the fuse signals F<1:N>. The fuse signals F<1:N> may be generated to be the same signals as the count signals CNT<1:N> which are inputted to the fuse unit 153 when the second test mode signal TM<2> is enabled.

The selection output unit 154 may be configured to selectively output one of the count signals CNT<1:N> and the fuse signals F<1:N> in response to the third mode signal TM<3>. For example, the selection output unit 154 may output the count signals CNT<1:N> as the delay control signals DCTR<1:N> when the third mode signal TM<3> is disabled. The selection output unit 154 may output the fuse signals F<1:N> as the delay control signals DCTR<1:N> when the third mode signal TM<3> is enabled.

Hereinafter, a test operation for controlling the parameters of the semiconductor memory device as set forth above will be described under the assumption that a level of the internal clock signal ICLK synchronized with a rising edge of the internal data strobe signal IDQS has a logic "low" level according to variations of processes, voltages and/or temperatures (PVT).

First, the internal clock generator 11 may receive the external clock signal CLK to generate the internal clock signal ICLK, and the clock delay unit 12 may delay the internal clock signal ICLK to generate the delayed clock signal ICLKD. A delay time of the clock delay unit 12 may be controlled according to the delay control signals DCTR<1:N>. The data strobe signal (DQS) generator 13 may generate the data strobe signal DQS for strobe of data in response to the delayed clock signal ICLKD, and the replica delay unit 14 may delay the data strobe signal DQS to generate the internal data strobe signal IDQS.

Next, if the first test mode signal TM<1> is enabled, the flag signal generator 151 may receive the read command signal RD_CMD to output a level of the internal clock signal ICLK synchronized with a rising edge of the internal data strobe signal IDQS as the flag signal FLAGB. For example, if a signal level of when the internal clock signal ICLK is synchronized with the rising edge of the internal data strobe signal DQS is a logic "low", the flag signal generator 151 outputs the low level signal as the flag signal FLAGB. For example, an enable level of the flag signal FLAGB may be a logic "low" level. The flag signal generator 151 may output the enabled flag signal FLAGB.

Next, while the first test mode signal TM<1> is enabled and the flag signal FLAGB is enabled to a logic "low" level, the counter 152 may receive the read command signal RD_CMD to sequentially increase a digital number of the count signals CNT<1:N> one bit by one bit. In such a case, the selection output unit 154 may output the count signals CNT<1:N> as the delay control signals DCTR<1:N> because the first test mode signal TM<1> is enabled and the third test mode signal TM<3> is not disabled. Thus, a delay time of the clock delay unit 12 may be increased by a unit delay time whenever a counting operation of the counter 152 is performed, and a point where a rising edge of the internal data strobe signal IDQS occurs may be delayed by the unit delay time of the clock delay unit 12. As a result, if the level of the internal clock signal ICLK synchronized with a rising edge of the internal data strobe signal IDQS has changed to a logic "high" level, the flag signal generator 151 may generate the flag signal FLAGB which is disabled to a logic "high" level. A counting operation of the counter 152 may be terminated by the flag signal FLAGB which is disabled to a logic "high" level.

Next, if the first test mode signal TM<1> is disabled and the second test mode signal TM<2> is enabled, the fuse unit 153 may program the N-number of fuses according to the count signals CNT<1:N> and may generate the fuse signals F<1:N> using the N-number of programmed fuses to output the fuse signals F<1:N>.

Subsequently, if the second test mode signal TM<2> is disabled and the third test mode signal TM<3> is enabled, the selection output unit 154 may output the fuse signals F<1:N> as the delay control signals DCTR<1:N>. Thus, the clock delay unit 12 may maintain the delay time which is set by the count signals CNT<1:N> generated at a point where a level of the flag signal FLAGB is changed from a logic "low" level to a logic "high" level.

As described above, the semiconductor memory device may be evaluated by a test that compares a phase of the internal data strobe signal IDQS with a phase of the internal clock signal ICLK and to delay a rising edge point of the internal data strobe signal IDQS in order to synchronize a phase of the internal data strobe signal IDQS with a phase of the internal clock signal ICLK. If the phase of the internal data strobe signal IDQS is synchronized with the phase of the internal clock signal ICLK through the test, the data strobe signal DQS may also be synchronized with the external clock signal CLK. Thus, the test may prevent the parameters, for example, an AC parameter 'tDQSCK' from being out of an allowable range even though the processes, voltages and/or temperatures (PVT) vary. Therefore, the semiconductor memory device may successfully operate without any malfunction in a read mode.

Meanwhile, a configuration of the semiconductor memory device according to the embodiment may be partially modified to execute the aforementioned test when a level of the internal clock signal ICLK synchronized with a rising edge of the internal data strobe signal IDQS has a logic "high" level. For example, the flag signal generator 151 may be modified to generate the flag signal FLAGB which is enabled to a logic "low" level until the internal clock signal ICLK synchronized with a rising edge of the internal data strobe signal IDQS is enabled to a logic "high" level. This modification of the flag signal generator 151 may be more readily achieved by changing a design scheme that compares a phase of the internal data strobe signal IDQS with a phase of the internal clock signal ICLK. Thus, a description to a test of the semiconductor memory device when a level of the internal clock signal ICLK synchronized with a rising edge of the internal data strobe signal IDQS has a logic "high" level may be omitted.

Figure 3:
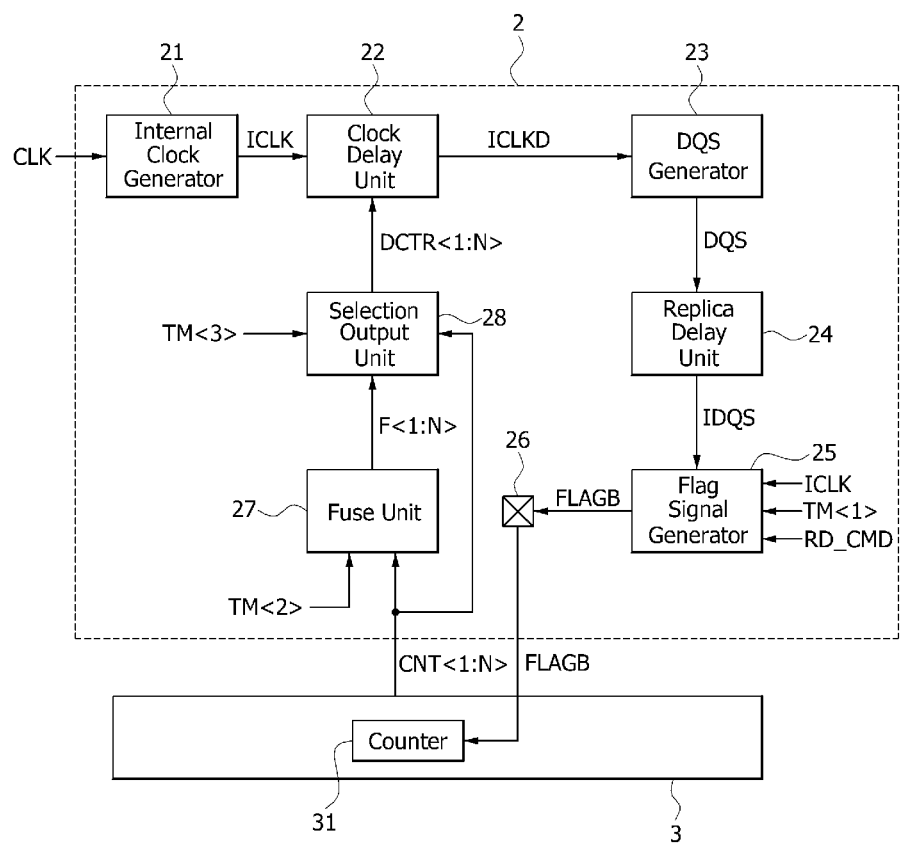
FIG. 3 is a block diagram illustrating a configuration of a semiconductor system according to some embodiments.

As shown in FIG. 3, a semiconductor system may be configured to include a semiconductor memory device 2 and a test circuit 3. The semiconductor memory device 2 may include an internal clock generator 21, a clock delay unit 22, a data strobe signal (DQS) generator 23, a replica delay unit 24, a flag signal generator 25, a pad 26, a fuse unit 27 and a selection output unit. The test circuit 3 may include a counter 31.

The internal clock generator 21 may receive an external clock signal CLK to generate an internal clock signal ICLK. In more detail, the internal clock generator 21 may buffer the external clock signal CLK and may reflect information such as a read latency and a burst length to generate the internal clock signal ICLK during a read operation.

The clock delay unit 22 may delay the internal clock signal ICLK to generate a delayed clock signal ICLKD. A delay time of the clock delay unit 22 may be controlled according to delay control signals DCTR<1:N>. For example, the delay time of the clock delay unit 22 may increase by a unit delay time whenever the delay control signals DCTR<1:N> are counted up by one bit.

The DQS generator 23 may generate a data strobe signal DQS for strobe of data in response to the delayed clock signal ICLKD. The DQS generator 23 may be configured using a general circuit that generates a data strobe signal in synchronization with a clock signal.

The replica delay unit 24 may delay the data strobe signal DQS to generate an internal data strobe signal IDQS. A delay time of the replica delay unit 24 may be set to be equal to that of the clock delay unit 22.

While the first test mode signal TM<1> is enabled, the flag signal generator 25 may receive a read command signal RD_CMD to generate a flag signal FLAGB which is enabled to a logic "low" level until a level of the internal clock signal ICLK synchronized with a rising edge of the internal data strobe signal IDQS is changed and to output the flag signal FLAGB to a pad 26. The pad 26 may correspond to a data pad through which data are outputted. The flag signal FLAGB may be disabled to a logic "high" level if a level of the internal clock signal ICLK synchronized with a rising edge of the internal data strobe signal IDQS is changed.

The fuse unit 27 may include N-number of fuses (not shown) which are programmed according to count signals CNT<1:N> when a second test mode signal TM<2> is enabled. The N-number of fuses may correspond to respective ones of the count signals CNT<1:N>, and each of the N-number of fuses may be cut or not according to the corresponding signal of the count signals CNT<1:N>. The fuse unit 27 may generate fuse signals F<1:N> using the N-number of programmed fuses and may output the fuse signals F<1:N>. The fuse signals F<1:N> may be generated to be the same signals as the count signals CNT<1:N> which are inputted to the fuse unit 27 when the second test mode signal TM<2> is enabled.

The selection output unit 28 may be configured to selectively output one of the count signals CNT<1:N> and the fuse signals F<1:N> in response to the third mode signal TM<3>. For example, the selection output unit 28 may output the count signals CNT<1:N> as the delay control signals DCTR<1:N> when a third mode signal TM<3> is disabled. The selection output unit 28 may output the fuse signals F<1:N> as the delay control signals DCTR<1:N> when the third mode signal TM<3> is enabled.

The counter 31 in the test circuit 3 may receive the flag signal FLAGB enabled to a logic "low" level to sequentially increase a digital number of the count signals CNT<1:N> one bit by one bit. The counter 31 may terminate a counting operation of the count signals CNT<1:N> if the flag signal FLAGB is disabled to a logic "high" level.

According to the semiconductor system set forth above, a test may be executed using a test circuit including a counter unlike the semiconductor memory device illustrated in FIGS. 1 and 2. That is, the semiconductor memory device 2 included in the semiconductor system illustrated in FIG. 3 may be fabricated without any counter. Thus, a chip size of the semiconductor memory device 2 can be reduced. The first to third test mode signals TM<1:3> may be generated in an external test circuit (e.g., the test circuit 3) separated from the semiconductor memory device 2 or may be generated in the semiconductor memory device 2. The first test mode signal TM<1> may be set to have an enablement period in which a level of the internal clock signal ICLK synchronized with a rising edge of the internal data strobe signal IDQS can be changed. The second test mode signal TM<2> may be set to have a period which is enabled after the enablement period of the first test mode signal TM<1> terminates, and the third test mode signal TM<3> may be set to have a period which is enabled after the enablement period of the second test mode signal TM<2> terminates.

Hereinafter, a test operation for controlling the parameters of the semiconductor system as set forth above will be described under the assumption that a level of the internal clock signal ICLK synchronized with a rising edge of the internal data strobe signal IDQS has a logic "low" level according to variations of processes, voltages and/or temperatures (PVT).

First, the internal clock generator 21 may receive the external clock signal CLK to generate the internal clock signal ICLK, and the clock delay unit 22 may delay the internal clock signal ICLK to generate the delayed clock signal ICLKD. A delay time of the clock delay unit 22 may be controlled according to the delay control signals DCTR<1:N>. The data strobe signal (DQS) generator 23 may generate the data strobe signal DQS for strobe of data in response to the delayed clock signal ICLKD, and the replica delay unit 24 may delay the data strobe signal DQS to generate the internal data strobe signal IDQS.

Next, if the first test mode signal TM<1> is enabled, the flag signal generator 25 may receive the read command signal RD_CMD to output a level of the internal clock signal ICLK synchronized with a rising edge of the internal data strobe signal IDQS as the flag signal FLAGB through the pad 26. For example, the flag signal FLAGB may be generated to have a logic "low" level corresponding to an enabled level.

Next, the counter 31 in the test circuit 3 may receive the flag signal FLAGB enabled to a logic "low" level to sequentially increase a digital number of the count signals CNT<1:N> one bit by one bit. Since the third test mode signal TM<3> has a disabled level, the selection output unit 28 may output the count signals CNT<1:N> as the delay control signals DCTR<1:N>. Thus, a delay time of the clock delay unit 22 may be increased by a unit delay time whenever a counting operation of the counter 31 is performed, and a point of time that a rising edge of the internal data strobe signal IDQS occurs may be delayed by the unit delay time of the clock delay unit 22. As a result, if a level of the internal clock signal ICLK synchronized with a rising edge of the internal data strobe signal IDQS has a logic "high" level, the flag signal generator 25 may generate the flag signal FLAGB which is disabled to a logic "high" level. A counting operation of the counter 31 may be terminated by the flag signal FLAGB which is disabled to a logic "high" level.

Next, if the first test mode signal TM<1> is disabled and the second test mode signal TM<2> is enabled, the fuse unit 27 may program the N-number of fuses according to the count signals CNT<1:N> and may generate the fuse signals F<1:N> using the N-number of programmed fuses to output the fuse signals F<1:N>.

Subsequently, if the second test mode signal TM<2> is disabled and the third test mode signal TM<3> is enabled, the selection output unit 28 may output the fuse signals F<1:N> as the delay control signals DCTR<1:N>. Thus, the clock delay unit 22 may maintain the delay time which is set by the count signals CNT<1:N> generated at a point of time that the flag signal FLAGB is changed from a logic "low" level to a logic "high" level.

As described above, the semiconductor system may be evaluated by a test that compares a phase of the internal data strobe signal IDQS with a phase of the internal clock signal ICLK to delay a rising edge point of the internal data strobe signal IDQS and to synchronize a phase of the internal data strobe signal IDQS with a phase of the internal clock signal ICLK. If the phase of the internal data strobe signal IDQS is synchronized with the phase of the internal clock signal ICLK through the test, the data strobe signal DQS may also be synchronized with the external clock signal CLK. Thus, the test may prevent the parameters, for example, an AC parameter 'tDQSCK' from being out of an allowable range even though the processes, voltages and/or temperatures (PVT) vary. Therefore, the semiconductor system may successfully operate without any malfunction in a read mode.

A configuration of the semiconductor system according to the embodiment may be partially modified to execute the aforementioned test when a level of the internal clock signal ICLK synchronized with a rising edge of the internal data strobe signal IDQS has a logic "high" level. For example, the flag signal generator 25 may be modified to generate the flag signal FLAGB which is enabled to a logic "low" level until the internal clock signal ICLK synchronized with a rising edge of the internal data strobe signal IDQS is enabled to a logic "high" level. This modification of the flag signal generator 25 may be more readily achieved by changing a design scheme that compares a phase of the internal data strobe signal IDQS with a phase of the internal clock signal ICLK. Thus, a description to a test of the semiconductor system when a level of the internal clock signal ICLK synchronized with a rising edge of the internal data strobe signal IDQS has a logic "high" level is omitted.

Thus, a delay time of an internal clock signal used in generation of a strobe signal may be adjusted to control parameters of a semiconductor memory device. Thus, malfunction of the semiconductor memory device may be prevented during a read operation.

While certain embodiments have been described above, it will be understood by those skilled in the art that the embodiments described are by way of example only. Accordingly, the semiconductor memory device and testing methods described herein should not be limited based on the described embodiments. Rather, the semiconductor memory device and testing methods described herein should only be limited in light of the claims that follow, when taken in conjunction with the above description and accompanying drawings.

What is claimed is:

1. A semiconductor memory device comprising:
a delay controller configured to compare a phase of an internal data strobe signal with a phase of an internal clock signal in response to first to third test mode signals and a read command signal to generate delay control signals;
a clock delay unit configured to delay the internal clock signal by a first delay time according to the delay control signals, and generate a delayed clock signal for creating a data strobe signal; and
a data strobe signal generator configured to generate the data strobe signal for strobe of data in response to the delayed clock signal.

2. The semiconductor memory device of claim 1:
wherein the internal clock signal is generated by delaying an external clock signal by a second delay time; and
wherein the internal data strobe signal is generated by delaying the data strobe signal by the second delay time.

3. The semiconductor memory device of claim 2, wherein when the first test mode signal is enabled, the delay controller is configured to compare a phase of the internal data strobe signal with a phase of the internal clock signal in response to the read command signal and count a digital number of count signals.

4. The semiconductor memory device of claim 3, wherein the delay controller is configured to program fuses according to the count signals when the second test mode signal is enabled, and generate fuse signals using the programmed fuses.

5. The semiconductor memory device of claim 4, wherein the delay controller is configured to output the count signals or the fuse signals as the delay control signals in response to the third test mode signal.

6. The semiconductor memory device of claim 2, wherein the delay controller includes:
a flag signal generator configured to generate a flag signal enabled until a level of the internal clock signal synchronized with a rising edge of the internal data strobe signal is changed; and
a counter configured to count a digital number of count signals when the flag signal is enabled.

7. The semiconductor memory device of claim 6, wherein the flag signal generator and the counter are configured to operate in response to the read command signal when the first test mode signal is enabled.

8. The semiconductor memory device of claim 7, wherein the delay controller further includes a fuse unit configured to have fuses programmed by the count signals and configured to generate fuse signals using the programmed fuses and to output the fuse signals when the second test mode signal is enabled.

9. The semiconductor memory device of claim 8, wherein the delay controller further comprises a selection output unit configured to selectively output one of the count signals and the fuse signals as the delayed control signals in response to the third test mode signal.

10. A semiconductor system comprising:
a semiconductor memory device configured to compare a phase of an internal data strobe signal with a phase of an internal clock signal to generate a flag signal outputted to a pad, program fuses in response to count signals and to generate fuse signals using the programmed fuses, and delay the internal clock signal by a first delay time controlled according to delayed control signals generated from the count signals or the fuse signals to generate a delayed clock signal for creating a data strobe signal; and
a test circuit configured to receive the flag signal to generate the count signals.

11. The semiconductor system of claim 10:
wherein the internal clock signal is generated by delaying an external clock signal by a second delay time; and
wherein the internal data strobe signal is generated by delaying the data strobe signal by the second delay time.

12. The semiconductor system of claim 11, wherein the semiconductor memory device is configured to include a flag signal generator that generates a flag signal enabled until a level of the internal clock signal synchronized with a rising edge of the internal data strobe signal is changed and outputs the flag signal to the pad.

13. The semiconductor system of claim 12, wherein the flag signal generator is configured to operate in response to a read command signal when a first test mode signal is enabled.

14. The semiconductor system of claim 12, wherein the semiconductor memory device is configured to further include a fuse unit that has fuses programmed by the count signals and generates fuse signals using the programmed fuses when a second test mode signal is enabled.

15. The semiconductor system of claim 14, wherein semiconductor memory device is configured to further include a selection output unit that selectively output the count signals and the fuse signals as the delayed control signals in response to a third test mode signal.

16. The semiconductor system of claim 15, wherein semiconductor memory device is configured to further include a data strobe signal generator that generates the data strobe signal in response to the delayed clock signal.

17. The semiconductor system of claim 12, wherein the test circuit is configured to include a counter that counts a digital number of the count signals when the flag signal is enabled.

18. A test method of controlling a parameter, the test method comprising:
comparing a phase of an internal data strobe signal with a phase of an internal clock signal in response to first to third test mode signals and a read command signal to generate delay control signals;
delaying the internal clock signal by a first delay time controlled according to the delay control signals to generate a delayed clock signal for creating a data strobe signal; and
generating the data strobe signal for strobe of data in response to the delayed clock signal.

19. The test method of claim 18, wherein the internal clock signal is generated by delaying an external clock signal by a second delay time and the internal data strobe signal is generated by retarding the data strobe signal by the second delay time.

20. The test method of claim 19, wherein generating the delay control signals includes comparing the phase of the internal data strobe signal with the phase of the internal clock signal in response to the read command signal to count a digital number of count signals when the first test mode signal is enabled.

21. The test method of claim 20, wherein counting the digital number of the count signals includes:
generating a flag signal enabled until a level of the internal clock signal synchronized with a rising edge of the internal data strobe signal is changed; and
counting the digital number of the count signals when the flag signal is enabled.

22. The test method of claim 20, wherein generating the delay control signals further includes:
programming fuses according to the count signals when the second test mode signal is enabled; and
generating fuse signals using the programmed fuses.

23. The test method of claim 22, wherein generating the delay control signals further includes outputting the count signals or the fuse signals as the delayed control signals in response to the third test mode signal.

* * * * *